(12) United States Patent
Lee et al.

(10) Patent No.: US 7,314,771 B2
(45) Date of Patent: Jan. 1, 2008

(54) ORGANIC LIGHT EMITTING ELEMENT, DISPLAY APPARATUS HAVING THE SAME AND METHOD OF MANUFACTURING THE SAME

(75) Inventors: Dong-Won Lee, Seongnam-si (KR); Joon-Hoo Choi, Seoul (KR); Jin-Koo Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 276 days.

(21) Appl. No.: 10/990,515

(22) Filed: Nov. 18, 2004

(65) Prior Publication Data

US 2005/0104061 A1     May 19, 2005

(30) Foreign Application Priority Data

Nov. 19, 2003     (KR) ............... 10-2003-0082364

(51) Int. Cl.
*H01L 21/00* (2006.01)
*H01L 51/40* (2006.01)

(52) U.S. Cl. .............. 438/34; 438/39; 438/99

(58) Field of Classification Search ........... 438/28–29, 438/34, 39, 99; 313/500, 505, 512
See application file for complete search history.

(56) References Cited

U.S. PATENT DOCUMENTS 5,678,483 A * 10/1997 Johnson .................. 101/153
6,743,556 B2 * 6/2004 Elizur et al. ................ 430/7
6,851,996 B2 * 2/2005 Blaessing et al. ........... 445/24
6,887,631 B2 * 5/2005 Kiguchi et al. .............. 430/7
6,940,578 B2 * 9/2005 Baek et al. ................ 349/187
2004/0201048 A1 * 10/2004 Seki et al. ................. 257/294
2005/0196969 A1 * 9/2005 Gunner et al. ............. 438/725

FOREIGN PATENT DOCUMENTS

WO    WO 2003083960 A1 * 10/2003

* cited by examiner

*Primary Examiner*—Shouxiang Hu
(74) *Attorney, Agent, or Firm*—Cantor Colburn LLP

(57) ABSTRACT

A method of manufacturing a display apparatus includes: forming a peripheral circuit, a first electrode and a bank on a substrate; forming a surface energy lowering pattern on the bank; forming an organic light emitting member on the first electrode; and forming a second electrode on the organic light emitting member. The first electrode receives a first driving signal. The first electrode has a first surface energy. The bank surrounds at least one side of the first electrode. The surface energy lowering pattern has a second surface energy which is lower than the first surface energy. The second electrode receives a second driving signal to display an image. Therefore, an image display quality of the display apparatus is improved.

7 Claims, 14 Drawing Sheets

FIG. 1
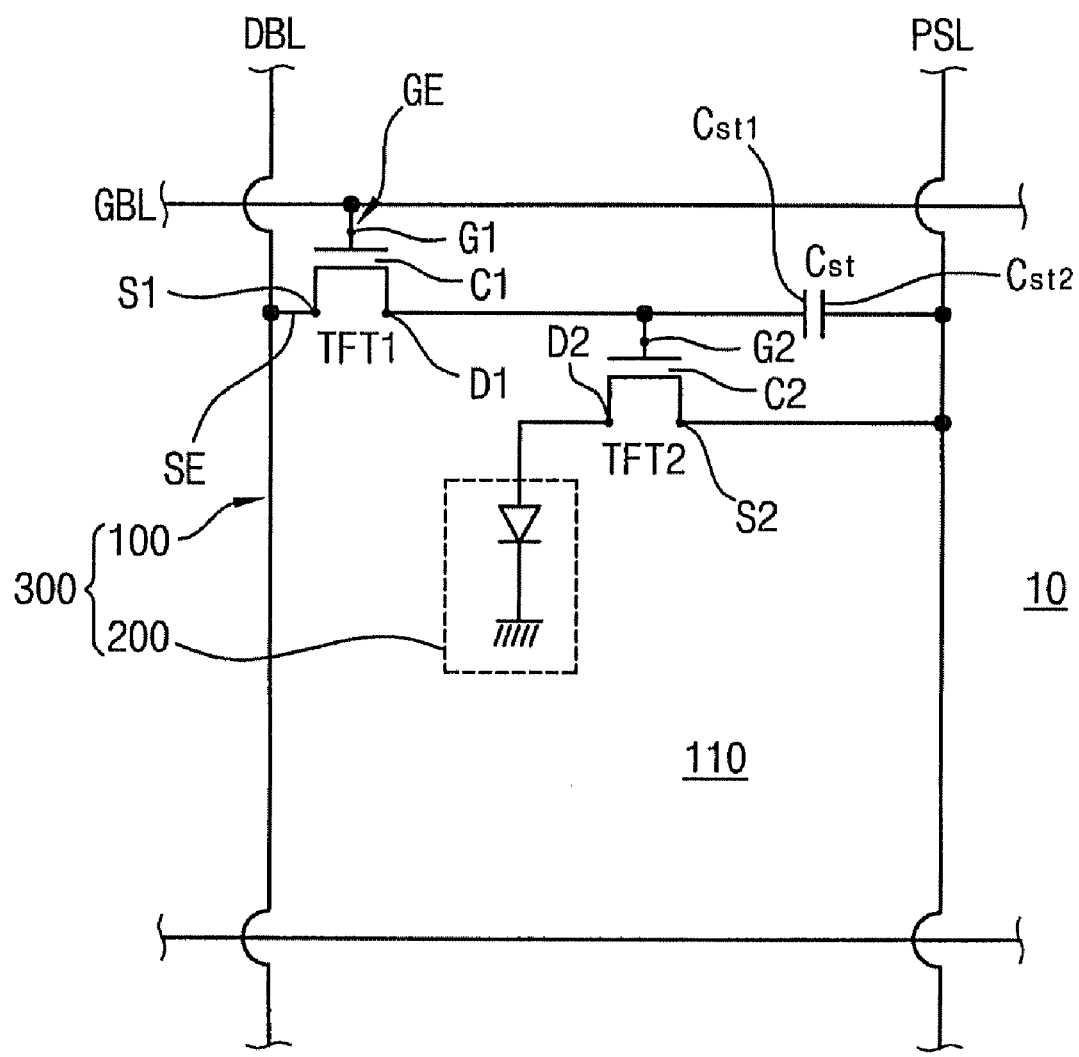
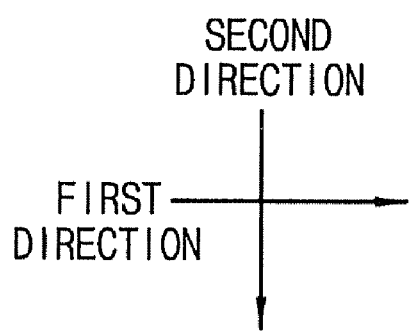

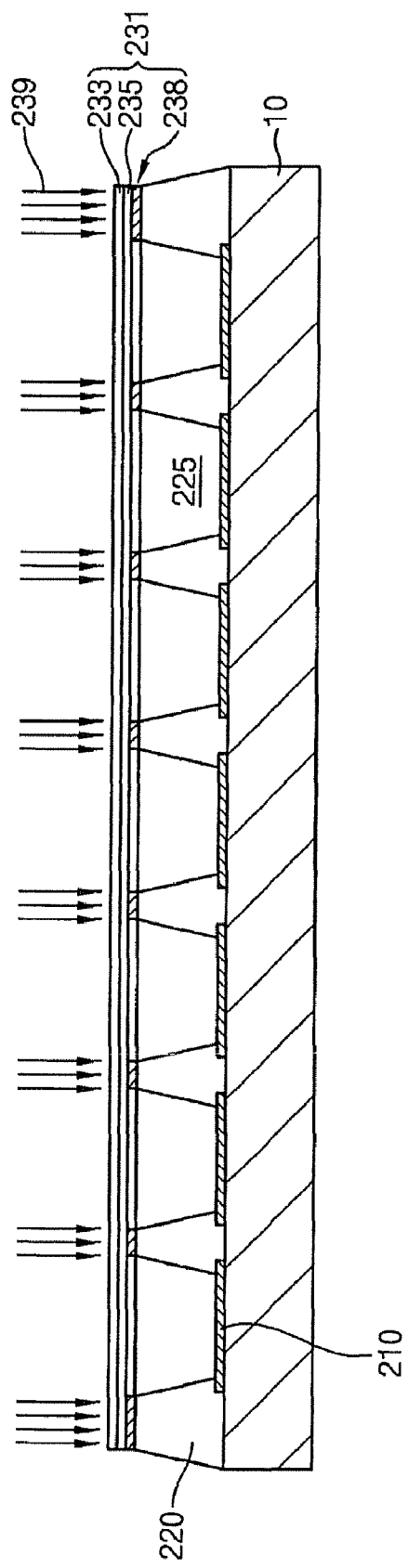

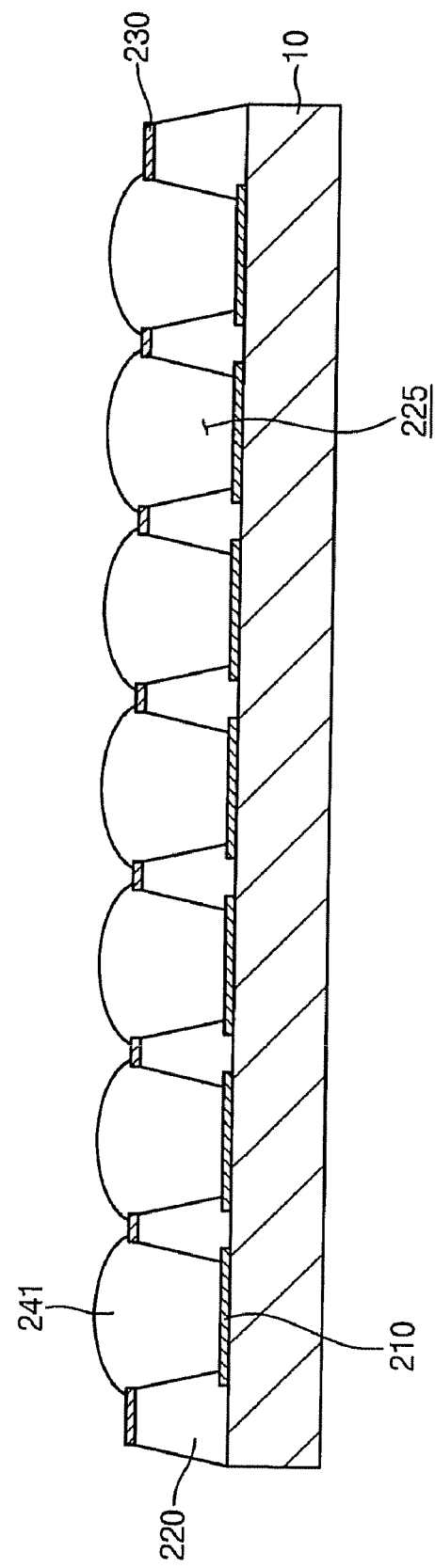

ORGANIC LIGHT EMITTING ELEMENT, DISPLAY APPARATUS HAVING THE SAME AND METHOD OF MANUFACTURING THE SAME

CROSS-REFERENCE OF RELATED APPLICATIONS

The present application claims priority from Korean Patent Application No. 2003-82364, filed on Nov. 19, 2003, the disclosure of which is hereby incorporated herein by reference in its entirety.

BACKGROUND OF THE INVENTION

1. Field of the Invention

The present invention relates to an organic light emitting element, a display apparatus and a method of manufacturing the display apparatus. More particularly, the present invention relates to an organic light emitting element capable of improving an image display quality, a display apparatus capable having the organic light emitting element, and a method of manufacturing the display apparatus.

2. Description of the Related Art

An information processing device has been improved, and has been widely used in various fields.

Data processed by the information processing device is an electric signal or a coded signal. However, a user may not directly recognize the electric signal or the coded signal. The information processing device has a display apparatus so that the electric signal or the coded signal is displayed by the display apparatus.

The display apparatus is classified into an emissive display apparatus and a non-emissive display apparatus. The emissive display apparatus displays the image using luminescence. The emissive display apparatus includes a cathode ray tube (CRT) display apparatus, a plasma display panel (PDP), a light emitting diode (LED), an inorganic light emitting display apparatus, an organic light emitting display (OLED) apparatus, etc.

The non-emissive display apparatus displays the image using reflection, scattering or interference of a light. The non-emissive display apparatus includes a liquid crystal display (LCD) apparatus, an electrochemical display (ECD) apparatus, an electrophoretic image display (EPID) apparatus, etc.

The inorganic light emitting display apparatus and the OLED apparatus have been widely used.

Electrons are accelerated in a light emitting portion of the inorganic light emitting display apparatus in strong electric field so that the accelerated electrons are combined with inorganic material, and the inorganic material is in an excited state. When the excited material is changed into a ground state, a light is generated in the light emitting portion.

The OLED apparatus has an organic light emitting layer formed between an anode electrode and a cathode electrode. Electrons from the anode electrode are combined with holes from the cathode electrode in the organic light emitting layer so that molecules of the organic light emitting layer are in the excited state. When the excited molecules are changed into the ground state, the light is generated in the organic light emitting layer.

The organic light emitting layer of the OLED apparatus may be formed through a screen printing method or a spray printing method. In the screen printing method, organic light emitting material is printed on a substrate through openings of a mask.

In the spray printing method, the organic light emitting material is dropped on a portion of the substrate. In particular, a bank is formed adjacent to the anode electrode that is formed on the substrate, and the organic light emitting material is dropped in a space formed by the bank. The dropped organic light emitting material is dried to form the organic light emitting layer.

When the organic light emitting material is dropped on the bank that has higher surface energy than the anode electrode, the organic light emitting layer may be formed on the bank so that the image display quality is deteriorated. When the bank has higher surface energy than the anode electrode, the bank has higher adhesive force than the anode electrode.

Surface structure of the bank may be changed to decrease the surface energy of the bank through an addition process. However, when the organic light emitting layer has a double layered structure having a hole injection layer and a light emitting layer formed on the hole injection layer, the surface energy of the bank may be changed after the hole injection layer being formed. When the light emitting layer is formed after the hole injection layer being formed, the surface energy of the bank is increased so that the light emitting layer may be attached to the bank. Therefore, the image display quality of the OLED apparatus may be deteriorated.

BRIEF SUMMARY OF THE INVENTION

The present invention provides an organic light emitting element capable of improving an image display quality.

The present invention also provides a display apparatus having the above-mentioned organic light emitting element.

The present invention also provides a method of manufacturing the above-mentioned display apparatus.

An organic light emitting element in accordance with an aspect of the present invention is formed on a substrate. The organic light emitting element includes a first electrode, a bank, a surface energy lowering pattern, an organic light emitting member and a second electrode. The first electrode receives a first driving signal. The first electrode has a first surface energy. The bank surrounds sides of the first electrode. The surface energy lowering pattern is formed on the bank. The surface energy lowering pattern has a second surface energy that is lower than the first surface energy. The organic light emitting member is formed on the first electrode. The second electrode receives a second driving signal to display an image.

A display apparatus in accordance with an aspect of the present invention includes a peripheral circuit and an organic light emitting element. The peripheral circuit is formed on a substrate to generate a first driving signal. The organic light emitting element is formed on the substrate. The organic light emitting element includes a first electrode, a bank, a surface energy, an organic light emitting member and a second electrode. The first electrode receives the first driving signal. The first electrode has a first surface energy. The bank surrounds sides of the first electrode. The surface energy lowering pattern is formed on the bank. The surface energy lowering pattern has a second surface energy that is lower than the first surface energy. The organic light emitting member is formed on the first electrode. The second electrode receives a second driving signal to display an image.

A display apparatus in accordance with another aspect of the present invention includes an organic light emitting element on a substrate. The organic light emitting element has a first electrode, a bank, a surface energy lowering pattern, an organic light emitting member and a second electrode. The first electrode is configured to receive a first driving signal. The bank surrounds sides of the first electrode, the bank having a first surface energy. The surface energy lowering pattern is formed on the bank. The surface energy lowering pattern has a second surface energy that is lower than the first surface energy. The organic light emitting member is formed on the first electrode. The second electrode is configured to receive a second driving signal to display an image.

A display apparatus in accordance with another aspect of the present invention includes a switching transistor, a driving transistor and an organic light emitting element. The switching transistor is formed on a substrate. The switching transistor has a first source/drain electrode and a first gate electrode. The driving transistor is formed on the substrate. The driving transistor has a second source/drain electrode and a second gate electrode electrically connected to the first source/drain electrode of the switching transistor. The organic light emitting element is formed on the substrate having the switching transistor and the driving transistor. The organic light emitting element has a first electrode, a bank, a surface energy lowering pattern, an organic light emitting member and a second electrode. The first electrode is electrically connected to the second source/drain electrode of the driving transistor. The bank is formed on the substrate having the first electrode. The bank surrounds sides of the first electrode to form a hole on the first electrode. The bank has a first surface energy. The surface energy lowering pattern is formed on the bank. The surface energy lowering pattern has a second surface energy that is lower than the first surface energy. The organic light emitting member is formed on the first electrode. The second electrode is formed on the substrate having the organic light emitting member.

A method of manufacturing the display apparatus in accordance with an aspect of the present invention is provided as follows. A first electrode that has a first surface energy is formed on a base substrate. The first electrode receives a first driving signal from a peripheral circuit. A bank that surrounds sides of the first electrode is formed on the base substrate. A surface energy lowering pattern is formed on the bank. The surface energy lowering pattern has a second surface energy that is lower than the first surface energy. An organic light emitting member is formed on the first electrode. A second electrode is formed on the organic light emitting member. The second electrode receives a second driving signal to display an image.

According to this present invention, when an organic light emitting material is dropped in a hole surrounded by a bank on an electrode, the organic light emitting material may not be attached to the bank so that an image display quality of a display apparatus is improved.

BRIEF DESCRIPTION OF THE DRAWINGS

The above and other advantages of the present invention will become more apparent by describing in detail exemplary embodiments thereof with reference to the accompanying drawings, in which:

FIG. 1 is a circuit diagram showing a display apparatus in accordance with an exemplary embodiment of the present invention;

FIGS. 6A to 6I are cross-sectional views showing a method of manufacturing a display apparatus in accordance with an exemplary embodiment of the present invention.

DESCRIPTION OF THE EMBODIMENTS

Figure 2:
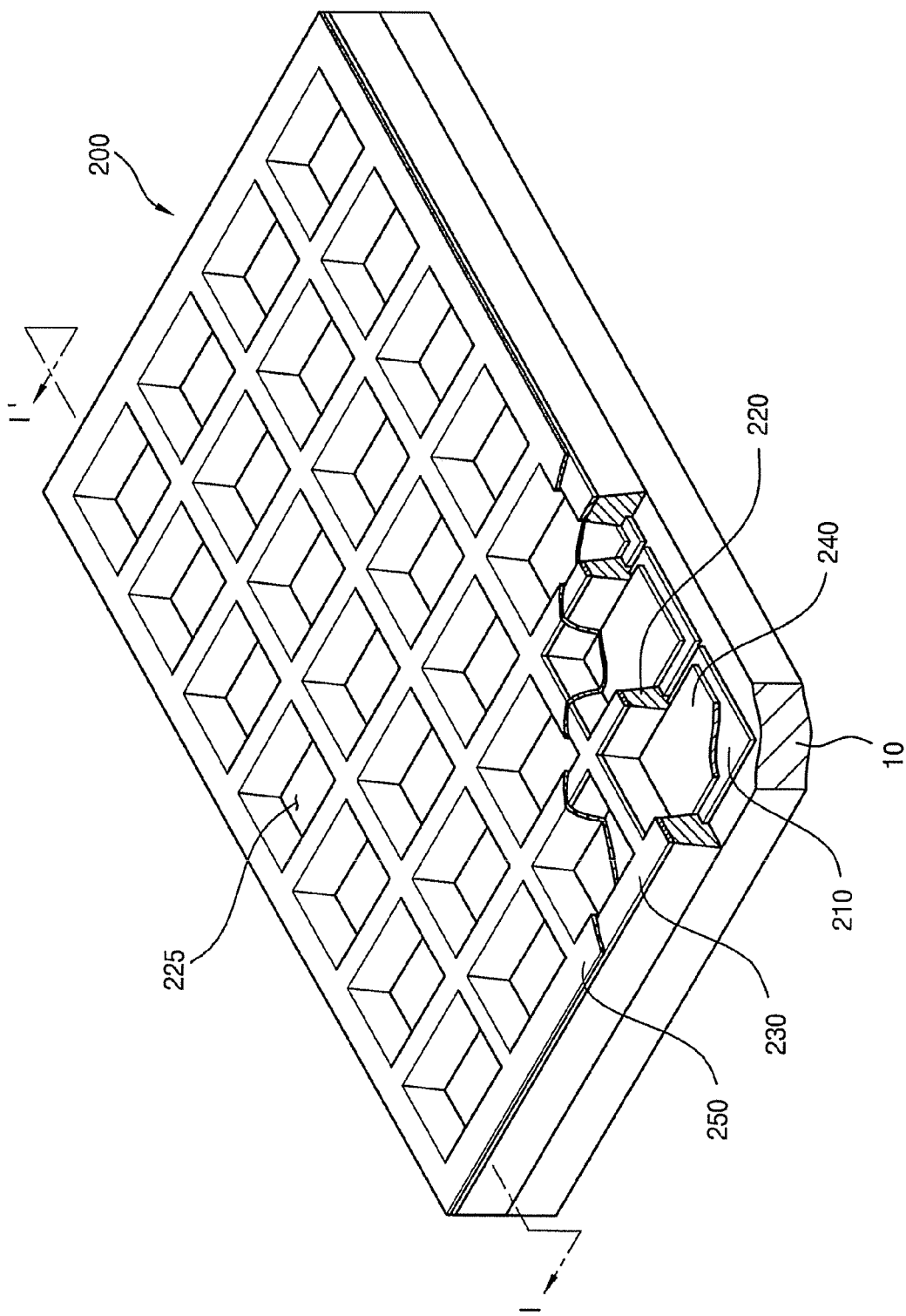
FIG. 2 is a partially cutout perspective view showing an organic light emitting is display (OLED) apparatus in accordance with an exemplary embodiment of the present invention.

It should be understood that the exemplary embodiments of the present invention described below may be varied modified in many different ways without departing from the inventive principles disclosed herein, and the scope of the present invention is therefore not limited to these particular following embodiments. Rather, these embodiments are provided so that this disclosure will be through and complete, and will fully convey the concept of the invention to those skilled in the art by way of example and not of limitation.

Hereinafter, the present invention will be described in detail with reference to the accompanying drawings.

FIG. 1 is a circuit diagram showing a display apparatus in accordance with an exemplary embodiment of the present invention.

Referring to FIG. 1, the display apparatus 300 includes a peripheral circuit 100 and an organic light emitting element 200. The peripheral circuit 100 and the organic light emitting element 200 are formed on a substrate 10.

The peripheral circuit 100 includes a switching transistor TFT1, a driving transistor TFT2, a storage capacitor $C_{st}$, a gate bus line GBL, a data bus line DBL and a power supply line PSL.

The gate bus line GBL is extended in a first direction. The gate bus line GBL has low resistance. The gate bus line GBL includes aluminum, aluminum alloy, etc.

A plurality of the gate bus lines GBLs may be formed on the substrate 10. In this exemplary embodiment, the display apparatus 300 displays full-color image, and the display apparatus 300 has a resolution of 1024×768. In addition, the display apparatus 300 has 768 gate bus lines GBLs.

Each of the gate bus lines GBLs is extended in the first direction. The gate bus lines GBLs are arranged in a second direction that is substantially perpendicular to the first direction.

A gate electrode GE is electrically connected to each of the gate bus lines GBLs. The gate electrode GE is extended in the second direction. In this exemplary embodiment, number of the gate electrodes GEs is 1024×3, and the gate electrodes GEs are spaced apart from one another by a predetermined interval.

The data bus line DBL is extended in the second direction. The data bus line DBL has low resistance. The data bus line DBL includes aluminum, aluminum alloy, etc.

A plurality of the data bus lines DBLs may be formed on the substrate 10. In this exemplary embodiment, number of the data bus lines DBLs is 1024×3. Each of the data bus lines DBLs is extended in the second direction. The data bus lines DBLs are arranged in the first direction.

A source electrode SE is electrically connected to each of the data bus lines DBLs. The source electrode SE is extended in the first direction. In this exemplary embodiment, number of the source electrodes SEs is 768, and the source electrodes SEs are spaced apart from one another by a predetermined interval.

The power supply line PSL is spaced apart from each of the data bus lines DBLs. The power supply line PSL is extended in the second direction. A direct current signal VDD is applied to the power supply line PSL.

The switching transistor TFT1 and the driving transistor TFT2 are formed in a pixel region 110. The pixel region 110 is defined by the gate bus lines GBLs disposed adjacent to each other, each of the data bus lines DBLs and each of the power supply lines PSLs.

The switching transistor TFT1 includes a first gate electrode G1, a first semiconductor pattern C1, a first source electrode S1 and a first drain electrode D1.

The first gate electrode G1 is electrically connected to each of the gate electrodes GEs that are electrically connected to the gate bus lines GBLs.

The first semiconductor pattern C1 is electrically insulated from the first gate electrode G1 by an insulating layer (not shown) having insulating material. The first semiconductor pattern C1 is formed on the insulating layer (not shown) corresponding to the first gate electrode G1.

The first source electrode S1 is disposed on the first semiconductor pattern C1, and electrically connected to each of the source electrodes SEs that are electrically connected to the data bus line DBLs.

The driving transistor TFT2 is formed in the pixel region 110. The driving transistor TFT2 includes a second gate electrode G2, a second semiconductor pattern C2, a second source electrode S2 and a second drain electrode D2.

The second gate electrode G2 is electrically connected to the first drain electrode D1 of the switching transistor TFT1.

The second semiconductor pattern C2 is electrically insulated from the second gate electrode G2 by the insulating layer (not shown) having the insulating material. The second semiconductor pattern C2 is formed on the insulating layer (not shown) corresponding to the second gate electrode G2.

The second source electrode S2 is formed on the second semiconductor pattern C2, and electrically connected to each of the power supply lines PSLs.

The second drain electrode D2 is formed on the second semiconductor pattern C2, and spaced apart from the second source electrode S2. The second drain electrode D2 is electrically connected to the organic light emitting element 200.

The storage capacitor $C_{st}$ includes a first capacitor electrode $C_{st1}$, a second capacitor electrode $C_{st2}$ and a dielectric layer. The first capacitor electrode $C_{st1}$ is electrically connected to the second gate electrode G2. The second capacitor electrode $C_{st2}$ is electrically connected to each of the power supply lines PSLs. The dielectric layer is disposed between the first and second capacitor electrodes $C_{st1}$ and $C_{st2}$ The dielectric layer may be an insulating layer. The storage capacitor $C_{st}$ maintains a voltage difference between the second gate electrode G2 and each of the power supply lines PSLs to turn on the second gate electrode G2 for one frame.

When a turn-on voltage is applied to each of the gate bus lines GBLs, and an image signal is applied to each of the data bus lines DBLs, the image signal is applied to the first drain electrode D1 through the first source electrode S1 of the switching transistor TFT1 and the first semiconductor pattern C1.

The image signal outputted from the first drain electrode D1 is applied to the second gate electrode G2 of the driving transistor TFT2 so that the second semiconductor pattern C2 is turned on. The resistance of the second semiconductor pattern C2 varies based on a level of the image signal that is applied to the second gate electrode G2. When the second semiconductor pattern C2 is turned on, the direct current signal outputted from the power supply line PSL is applied to the second drain electrode D2 through the second source electrode S2 and the second semiconductor pattern C2. The level of the direct current voltage outputted from the power supply line PSL is decreased based on the resistance of the second semiconductor pattern C2. Therefore, a first driving signal that has a level corresponding to the image signal is applied to the second drain electrode D2.

FIG. 2 is a partially cutout perspective view showing an organic light emitting display (OLED) apparatus in accordance with an exemplary embodiment of the present invention.

Referring to FIGS. 1 and 2, the organic light emitting element 200 includes a first electrode 210, a bank 220, a surface energy lowering pattern 230, an organic light emitting layer 240 and a second electrode 250.

The first driving signal outputted from the second drain electrode D2 of the driving transistor TFT2 is applied to the first electrode 210. The first electrode 210 has a transparent conductive material such as indium tin oxide (ITO), tin oxide (TO), indium zinc oxide (IZO), zinc oxide (ZO), etc. The first electrode 210 may be electrically connected to the second drain electrode D2 through a contact hole.

A plurality of the first electrodes 210 may be arranged in a matrix shape on the substrate 10. In this exemplary embodiment, the resolution of the display apparatus 300 is 11024×768, and the display apparatus has 1024×768×3 first electrodes 210.

Each of the first electrodes 210 has a first surface energy. The first surface energy varies based on the material of the first electrodes 210. When the surface energy is increased, a frictional force and an adhesive force between the first electrodes 210 and a fluid are increased. In addition, when the surface energy is decreased, a frictional force and an adhesive force between the first electrodes 210 and the fluid are decreased.

Figure 3:
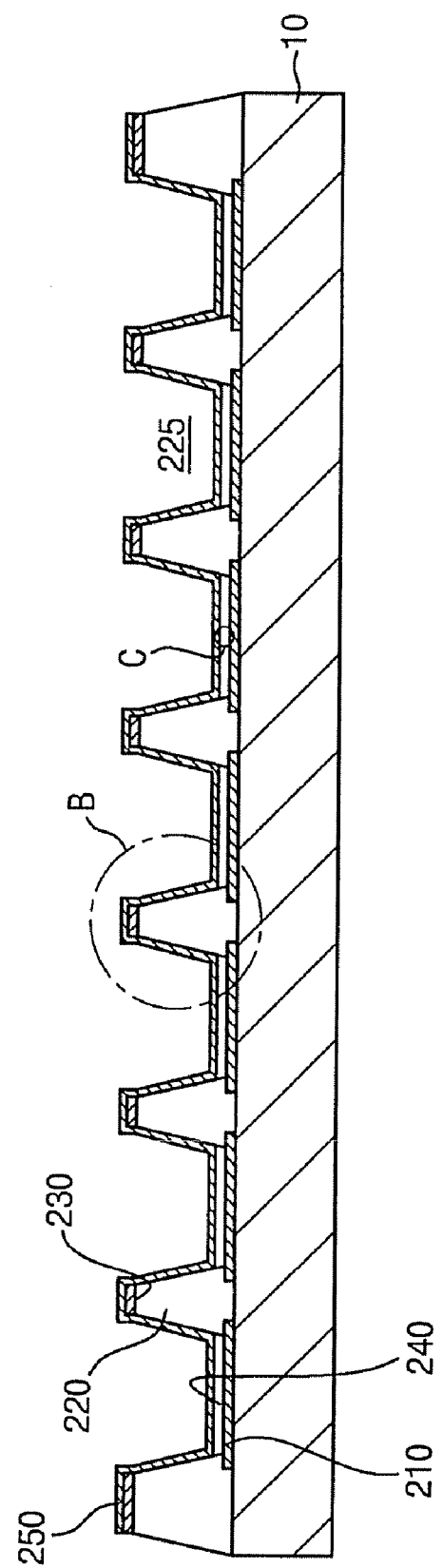
FIG. 3 is a cross-sectional view taken along a line I-I' shown in FIG. 2.
Figure 4:
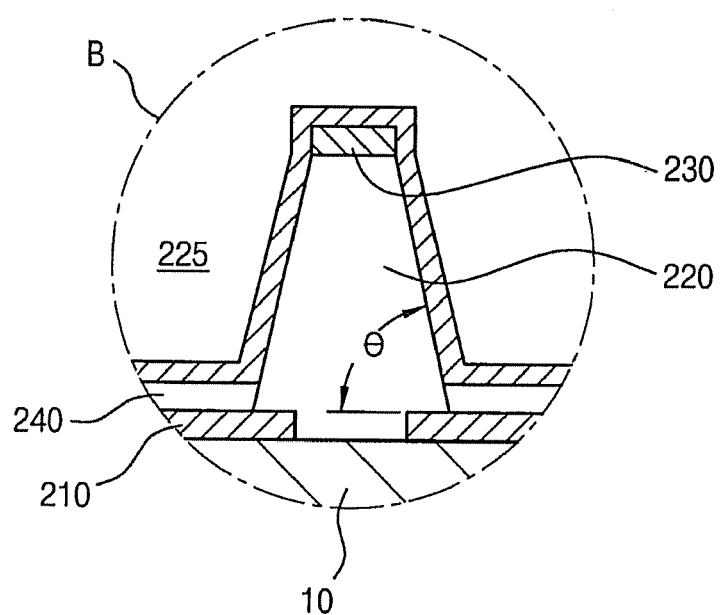
FIG. 4 is an enlarged cross-sectional view showing a portion 'B' shown in FIG. 3.

FIG. 3 is a cross-sectional view taken along a line I-I' shown in FIG. 2. FIG. 4 is an enlarged cross-sectional view showing a portion 'B' shown in FIG. 3.

Referring to FIGS. 2 to 4, the bank 220 surrounds sides of each of the first electrodes 210 on the substrate 10 to form a hole 225. The bank 220 may have a wall shape. In this exemplary embodiment, the bank 220 has a trapezoidal cross-section. A surface of the bank 220 forms a taper angle of about 60° to about 150° with respect to a surface of each of the first electrodes 210. The bank 220 may be formed through a photo process using a photosensitive material. The photosensitive material may include a positive photoresist, a negative photoresist, etc. Alternatively, an organic layer (not shown) or an inorganic layer (not shown) is patterned through a photolithography to form the bank. That is, the organic layer (not shown) or the inorganic layer (not shown) may be deposited on the substrate, and the deposited layer may be patterned through a photo process and an etching process.

In this exemplary embodiment, the bank 220 has lower surface energy than the first electrodes 210. When the bank 220 has higher surface energy than the first electrodes, the organic light emitting layer 240 may be formed on the bank 220 so that an image display quality of the display apparatus is deteriorated.

The surface energy lowering pattern 230 is formed on the bank 220. The surface energy lowering pattern 230 may be formed on a whole surface of the bank 220, a portion of the bank 220 or only top surface of the bank 220. A contact angle of the surface energy lowering pattern 230 is no less than about 40° with respect to water.

The surface energy lowering pattern 230 has a second surface energy that is lower than the first electrodes 210 and the bank 220. The surface energy lowering pattern 230 includes a synthetic resin having fluorine, a fluorine-containing compound such as $SF_6$, $CF_4$, oxygen, etc. The synthetic resin may be an epoxy resin, a silicone resin, an acrylic resin, an urethane resin, a phenolic resin, polyethylene, polypropylene, polystyrene, polymethyl metacrylate, polyurea, polyimide, etc. In this exemplary embodiment, the surface energy lowering film 238 has the epoxy resin containing fluorine. The surface energy lowering pattern 230 may be formed on the bank 220 as a thin film shape. Alternatively, liquid having the fluorine or the fluorine compound may be coated on the bank 220 to form the surface energy lowering pattern 230.

The second surface energy of the surface energy lowering pattern 230 may not be changed during a manufacturing process of the display apparatus. That is, the second surface energy of the surface energy lowering pattern 230 may not be changed though a predetermined time has passed.

Figure 5:
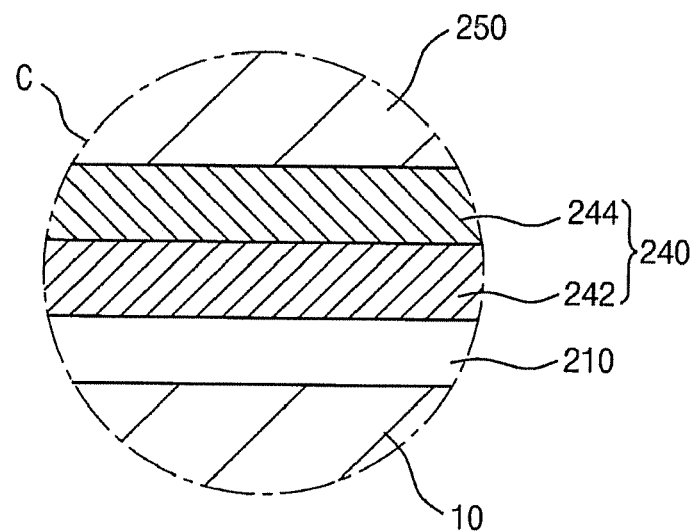
FIG. 5 is an enlarged cross-sectional view showing a portion 'C' shown in FIG. 3.

FIG. 5 is an enlarged cross-sectional view showing a portion 'C' shown in FIG. 3.

Referring to FIGS. 3 and 5, the organic light emitting layer 240 is formed in the hole 225 formed by the bank 220 that has the surface energy lowering pattern 230. In this exemplary embodiment, the organic light emitting layer 240 has a hole injection layer 242 and a light emitting layer 244.

In order to form the hole injection layer 242, a liquid that forms the hole injection layer 242 is dropped in the hole 225. The dropped liquid is dried to form the hole injection layer 242 on the first electrode 210. In this exemplary embodiment, the liquid is not dropped on the bank 220 by a repellent force between the dropped liquid and the bank 220. The repellent force is caused by the low surface energy of the surface energy lowering pattern 230. Alternatively, the liquid may be dropped on a portion of the bank 220.

In order to form the light emitting layer 244, an organic material that forms the light emitting layer 244 is dropped in the hole 225 in which the hole injection layer 242 is formed. The dropped organic material is dried to form the light emitting layer 244. In this exemplary embodiment, the light emitting layer 244 is not formed on the bank 220.

The second electrode 250 is formed on the substrate 10 having the organic light emitting layer 240. A second driving signal is applied to the second electrode 250 to display the image. In this exemplary embodiment, the second electrode 250 has aluminum, aluminum alloy, etc. The second electrode 250 may be formed through a sputtering method, a chemical deposition method, etc.

FIGS. 6A to 6I are cross-sectional views showing a method of manufacturing a display apparatus in accordance with an exemplary embodiment of the present invention. A peripheral circuit (not shown) is formed before a first electrode is formed. The peripheral circuit has two thin film transistors, one capacitor, a gate bus line, a data bus line and a power supply line. The peripheral circuit of FIGS. 6A to 6I is the same as the peripheral circuit 100 in FIGS. 1 to 5. Thus, the same reference numerals will be used to refer to the same or like parts as those described in FIGS. 1 to 5 and any further explanation will be omitted.

Figure 6A:
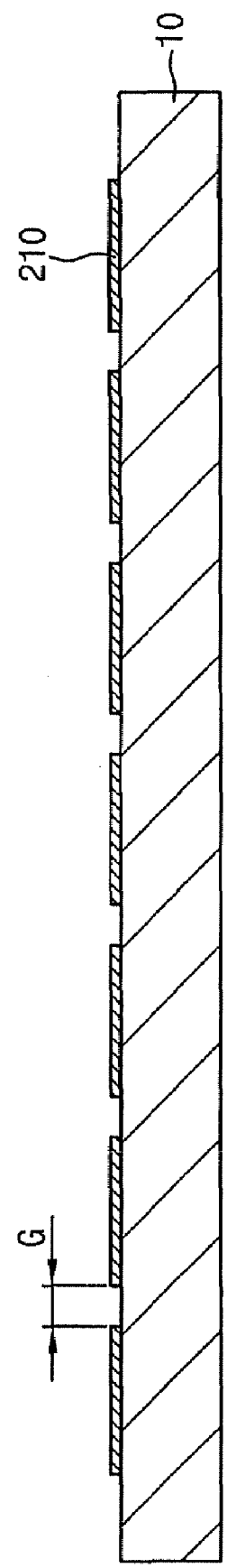

Referring to FIG. 6A, first electrodes 210 are formed on a substrate 10 having the peripheral circuit not shown. A transparent conductive material such as indium tin oxide (ITO), indium zinc oxide (IZO), etc., is deposited on the substrate 10 having the peripheral circuit 100. The deposited transparent conductive material is patterned to form the first electrodes 210. In this exemplary embodiment, a resolution of the display apparatus 300 is 1024×764, and number of the first electrodes 210 is 1024×764×3. The first electrodes 210 are arranged in a matrix shape. The first electrodes 210 are spaced apart from one another by a predetermined interval G. The first electrode 210 has a first surface energy.

Figure 6B:
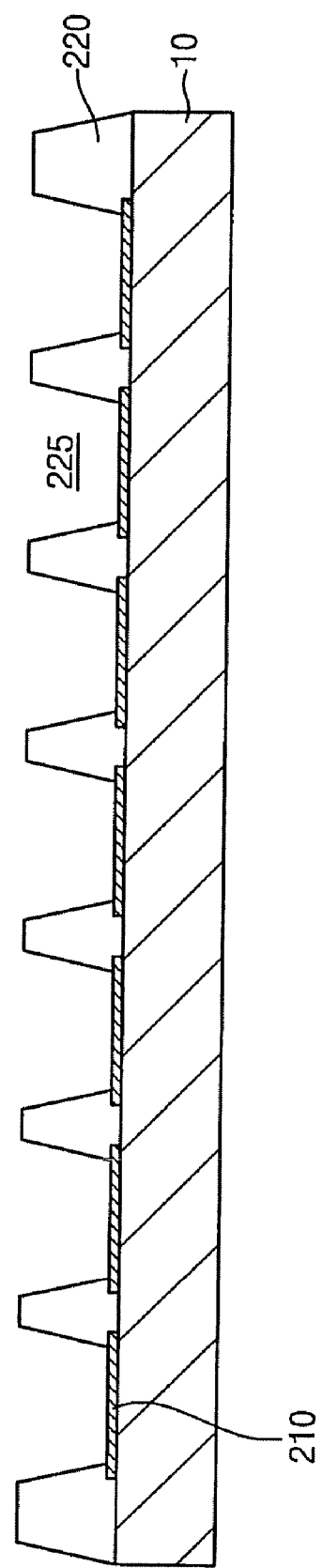

Referring to FIG. 6B, a photosensitive thin film is formed on the first substrate 10 through a spin coating method. A thickness of the photosensitive thin film is about 3 um. The photosensitive thin film is exposed by a light, and developed by a developer solution so that the photosensitive thin film is patterned to form a bank 220. The bank 220 surrounds sides of each of the first electrodes 210 to form a hole 225 on each of the first electrodes 210. The bank 220 is then baked so that the bank 220 may not be changed by the light.

Referring to FIG. 6C, a surface energy lowering printing sheet 231 is formed on the bank 220.

The surface energy lowering printing sheet 231 has a base film 233, a conversion film 235 and a surface energy lowering film 238. The base film 233 includes triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cyclo-olefin polymer (COP), etc. The conversion film 235 is formed on the base film 233. The conversion film 235 includes isocynate, vinyl acetate, polyester, polyvinyl alcohol, acrylate, etc. In this exemplary embodiment, the conversion film 235 has the vinyl acetate. The surface energy lowering film 238 is formed on the conversion film 235. The surface energy lowering film 238 includes a synthetic resin having fluorine, a fluorine-containing compound, oxygen, etc. The synthetic resin may be an epoxy resin, a silicone resin, an acrylic resin, an urethane resin, a phenolic resin, polyethylene, polypropylene, polystyrene, polymethyl metacrylate, polyurea, polyimide, etc. In this exemplary embodiment, the surface energy lowering film 238 has the epoxy resin containing fluorine. When the light or a laser beam is irradiated onto the conversion film 235, a heat is generated in the conversion film 235. The surface energy lowering film 238 has fluorine or the fluorine-containing compound so that the surface energy lowering film 238 has lower surface energy than the bank 220 and the first electrodes 210.

In this exemplary embodiment, the surface energy lowering film 238 is detached from the conversion film 235, and has a second surface energy that is lower than the first surface energy.

The surface energy lowering film 238 of the surface energy lowering printing sheet 231 is formed on the bank 220. A laser beam 239 is selectively irradiated onto an upper surface of the bank 220.

The laser beam 239 passes through the base film 233, and the laser beam 239 is irradiated onto the conversion film 235. The heat is generated from the conversion film 235, and the heat is transferred into the surface energy lowering film 238.

Figure 6D:
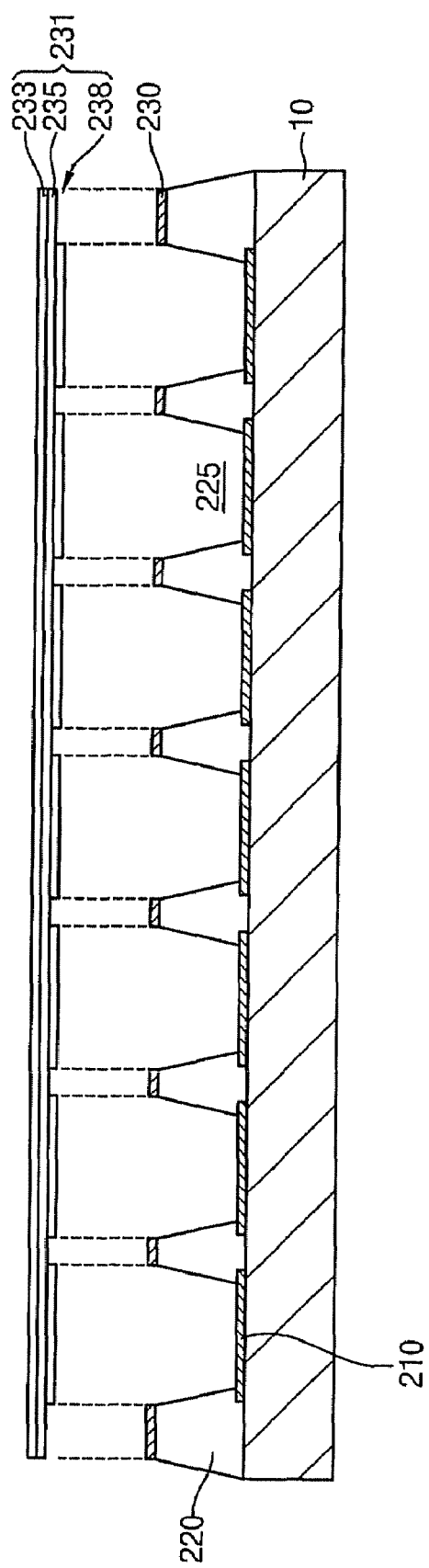

Referring to FIG. 6D, the heated portion of the surface energy lowering film 238 is detached from a remaining portion of the surface energy lowering film 238 and the conversion film 235 so that a surface energy lowering paffem 230 having the second surface energy is formed on the bank 220.

Referring to FIG. 6E, a hole injection composition 241 that has high fluidity is dropped in the hole 225 on each of the first electrodes 210. The hole injection composition 241 has a hole injection material, a volatile solvent, additives, etc. The volatile material may be propylene glycol monomethyl ether, propylene glycol monomethyl ether acetate, ethylene glycol monomethyl ether acetate, ethyl ethoxy propionate, cyclohexanone, diethylene glycol dimethyl ether, etc., or combinations thereof.

The dropped hole injection composition 241 is dried so that the volatile material is evaporated. When the volatile material is evaporated, size and height of the hole injection composition 241 are decreased. The bank 220 has lower surface energy than the second surface energy of the surface energy lowering paffern 230 so that the hole injection composition 241 may not be affached to the bank 220.

Figure 6F:
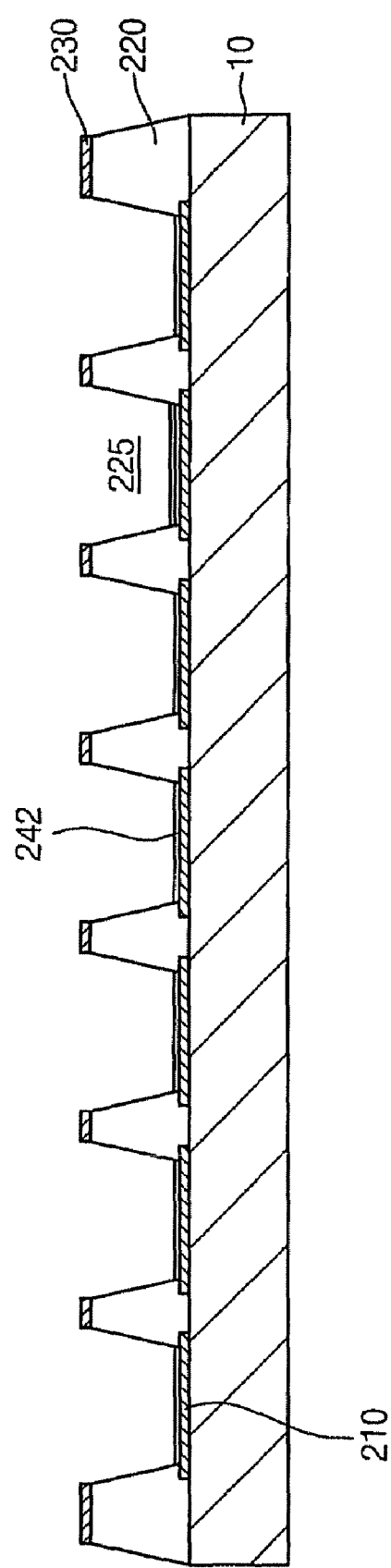

Referring to FIG. 6F, the hole injection layer 242 having a thin film shape is formed on each of the first electrodes 210.

Figure 6G:
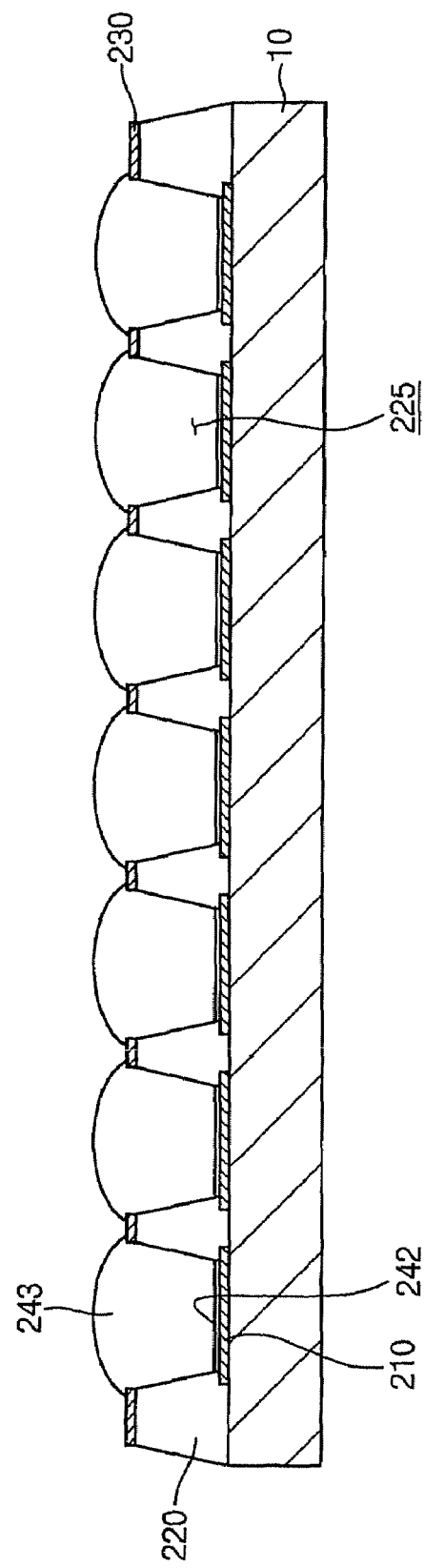

Referring to FIG. 6G, a light emitting composition 243 that has high fluidity is dropped in the hole 225 on the hole injection layer 242. The light emitting composition 243 has a light emitting material, a volatile solvent, additives, etc. The volatile solvent may be propylene glycol monomethyl ether, propylene glycol monomethyl ether acetate, ethylene glycol monomethyl ether acetate, ethyl ethoxy propionate, cyclohexanone, diethylene glycol dimethyl ether, etc., or combinations thereof.

The dropped light emiffing composition 243 is dried so that the volatile material in the dropped light emiffing composition 243 is evaporated. When the volatile material is evaporated, size and height of the light emitting composition 243 are decreased. The bank 220 has a lower surface energy than the second surface energy of the surface energy lowering pattern 230 so that the light emitting composition 243 may not be attached to the bank 220.

Figure 6H:
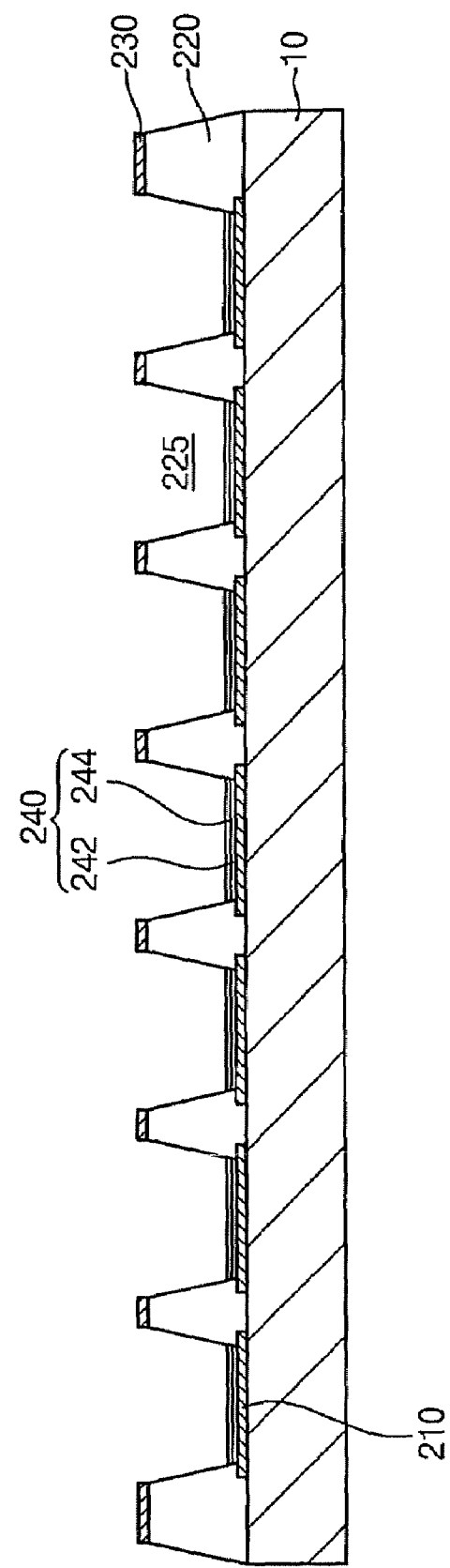
Figure 61:
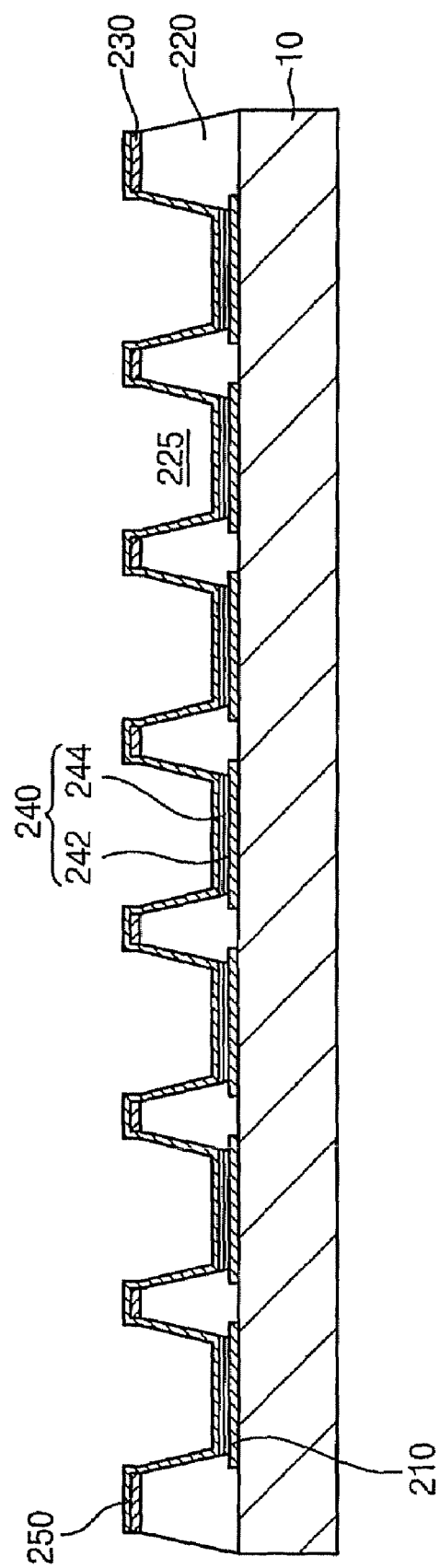

Referring to FIG. 6H, a light emitting layer 244 having a thin film shape is formed on the hole injection layer 242. The hole injection layer 242 and the light emitting layer 244 form an organic light emitting layer 240.

Referring to FIG. 6I, a second electrode 250 is formed on the substrate 10. The second electrode 250 may include aluminum, aluminum alloy, etc. The second electrode 250 is formed on the bank 220 and the organic light emitting layer 240 so that the organic light emitting layer 240 is electrically connected to the second electrode 250. In order to display the image, a second driving signal is applied to the second electrode 250.

Figure 7:
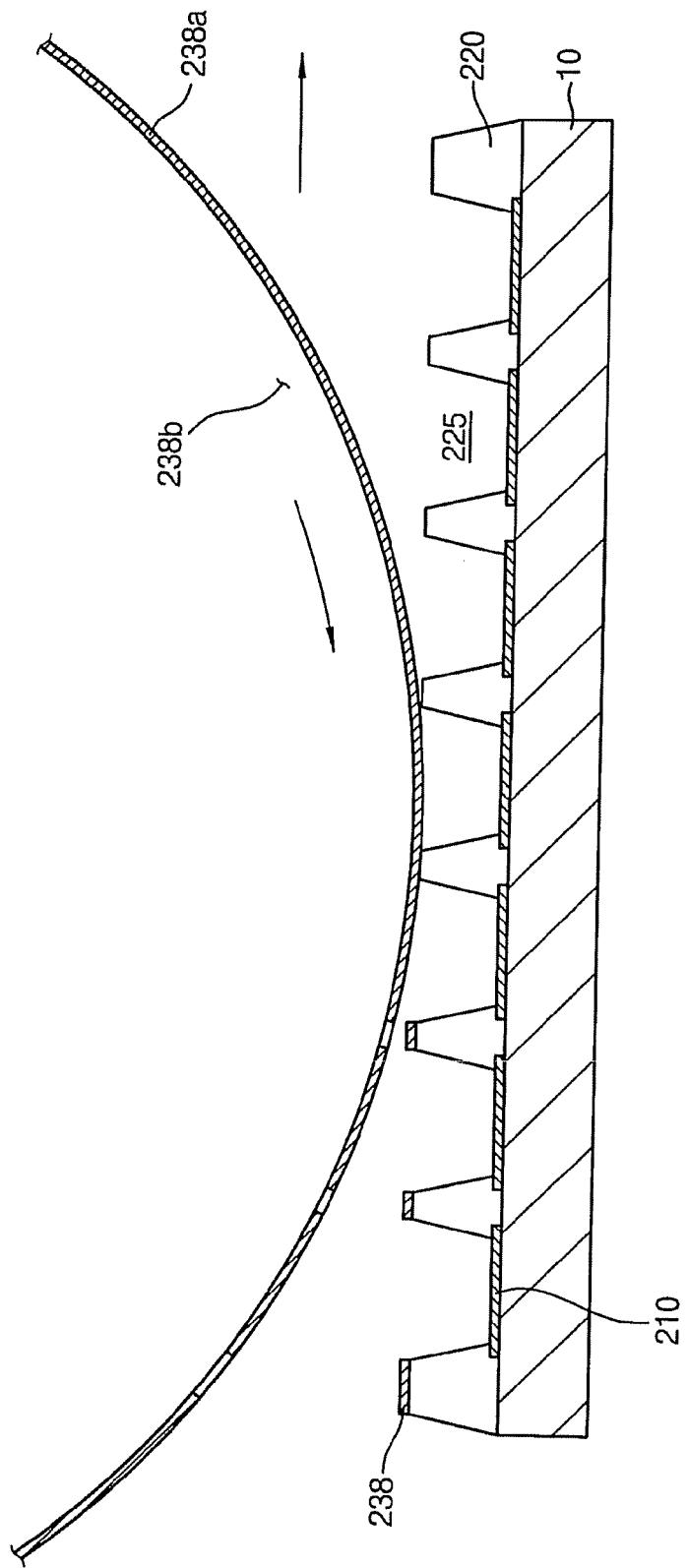
FIG. 7 is a cross-sectional view showing a method of manufacturing a display apparatus in accordance with another exemplary embodiment of the present invention.

FIG. 7 is a cross-sectional view showing a method of manufacturing a display apparatus in accordance with another exemplary embodiment of the present invention. The method of FIG. 7 is same as in FIGS. 6A to 6I. Thus, the same reference numerals will be used to refer to the same or like parts as those described in FIGS. 6A to 6I and any further explanation will be omitted.

Referring to FIG. 7, a roller 238b is disposed on a bank 220. A surface energy lowering material 238a is coated on an outer surface of the roller 238b. The coated surface energy lowering material 238a is disposed between the roller 238b and the bank 220.

The roller 238b rotates in a predetermined direction so that the coated surface energy lowering material 238a is coated on the bank 220 to form a surface energy lowering coating film 238.

According to the present invention, when an organic light emitting material is is dropped in a hole surrounded by a bank on an electrode, the organic light emitting material may not be attached to the bank so that an image display quality of a display apparatus is improved.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A method of manufacturing a display apparatus comprising:
   forming a peripheral circuit on a base substrate;
   forming a first electrode which has a first surface energy on the base substrate, the first electrode configured to receive a first driving signal from the peripheral circuit;
   forming a bank on the base substrate, the bank disposed on at least one side of the first electrode on the base substrate;
   forming a surface energy lowering printing sheet on the bank, the surface energy lowering printing sheet having a surface energy lowering film, a conversion film and a base film;
   forming a surface energy lowering pattern having a second surface energy which is lower than the first surface energy on the bank, the forming the surface energy lowering pattern comprising irradiating a laser beam onto the surface energy lowering printing sheet to print a portion of the surface energy lowering film onto the bank;
   forming an organic light emitting member on the first electrode, the forming the organic light emitting member on the first electrode comprising forming a light emitting layer on the first electrode; and
   forming a second electrode on the organic light emitting member, the second electrode configured to receive a second driving signal to display an image.

2. The method of claim 1, further comprising forming a plurality of the first electrodes arranged in a matrix shape on the base substrate.

3. The method of claim 1, wherein the bank is formed by:
   forming a photosensitive layer on the base substrate; and
   patterning the photosensitive layer to form a hole so that the first electrode is exposed through the hole.

4. The method of claim 1, wherein the surface energy lowering film is printed by heating the conversion film by the laser beam to cut the surface energy lowering film.

5. The method of claim 1, wherein the surface energy lowering printing sheet comprises at least one of a synthetic resin having fluorine, a fluorine-containing compound, oxygen or combinations thereof.

6. The method of claim 3, wherein the forming the organic light emitting member comprises:
   dropping a first organic light emitting material in the hole; and
   drying the dropped first organic light emitting material to form a first organic lighting layer as a thin film shape.

7. The method of claim 6, wherein the forming the organic light emitting member further comprises forming a hole injection layer on the first electrode.

* * * * *